United States Patent
Hurrell

(10) Patent No.: US 7,589,659 B2
(45) Date of Patent: Sep. 15, 2009

(54) SUCCESSIVE APPROXIMATION ANALOG TO DIGITAL CONVERTER

(75) Inventor: Christopher Peter Hurrell, Cookham (GB)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 11/825,027

(22) Filed: Jul. 3, 2007

(65) Prior Publication Data

US 2008/0012744 A1    Jan. 17, 2008

Related U.S. Application Data

(60) Provisional application No. 60/830,414, filed on Jul. 12, 2006.

(51) Int. Cl.
*H03M 1/34* (2006.01)
(52) U.S. Cl. .................. 341/163; 341/144; 341/155; 341/172
(58) Field of Classification Search .............. 341/144, 341/155, 163, 172
See application file for complete search history.

(56) References Cited

U.S. PATENT DOCUMENTS 5,684,487 A * 11/1997 Timko .................. 341/172
6,867,721 B1 * 3/2005 Lin .................... 341/144
7,026,975 B1    4/2006 Steward et al.
7,199,745 B2 * 4/2007 Tachibana et al. ......... 341/163
2003/0146776 A1    8/2003 Nakase
2005/0107073 A1    5/2005 Cheiky et al.

FOREIGN PATENT DOCUMENTS

GB    2082858    3/1982

OTHER PUBLICATIONS

PCT/US2007/015524, search report and written opinion, Apr. 16, 2008.

* cited by examiner

*Primary Examiner*—Jean B Jeanglaude
(74) *Attorney, Agent, or Firm*—Wolf, Greenfield & Sacks, P.C.

(57) ABSTRACT

A successive approximation analog to digital converter comprising a plurality of capacitors which during a successive approximation conversion are selectively connectable to a first reference or a second reference under the command of a controller. During a conversion step where the connections of a given capacitor may be varied, the switches to the given capacitor are both placed in a high impedance state during a decision period of a comparator.

20 Claims, 9 Drawing Sheets

| BIT ↓ | TRIAL 1 | 2 | 3 | 4 | 5 | 6 | 7 |
|---|---|---|---|---|---|---|---|
| 1 | * | | | | | | |
| 2 | * | * | | | | | |
| 3 | | * | * | | | | |
| 4 | | | * | * | | | |
| 5 | | | | * | * | | |
| 6 | | | | | * | * | |
| 7 | | | | | | * | * |
| 8 | | | | | | | * |

Fig. 7

SUCCESSIVE APPROXIMATION ANALOG TO DIGITAL CONVERTER

This application claims priority under 35 U.S.C. § 119(e) to U.S. Provisional Application Ser. No. 60/830,414, entitle "SUCCESSIVE APPROXIMATION ANALOG TO DIGITAL CONVERTER," filed on Jul. 12, 2006, which is herein incorporated by reference in its entirety.

FIELD OF THE INVENTION

The present invention relates to a successive approximation Analog to Digital Converter, and in particular to a converter where the sequence for controlling switches connecting capacitors in a capacitor array to first or second reference voltages has been modified so as to improve the speed of the analog to digital converter.

BACKGROUND OF THE INVENTION

Successive approximation converters using switched capacitor arrays are well known.

An example of an idealized differential input successive approximation switched capacitor analog to digital converter is shown in FIG. 1. This converter receives a differential signal on its signal inputs Vinp and Vinn, and fixed inputs Vref, and GND. The Vref input and the GND input define an allowable operating range of the converter such that $-(Vref-GND) \leq (Vinp-Vinn) \leq (Vref-GND)$. The converter comprises two switched capacitor arrays, designated DAC-P and DAC-N (but which may also be referred to as P array and N array herein) which connect to the positive input and negative input, respectively, of a comparator 12. The capacitor arrays DAC-P and DAC-N are mirror images of one another and, for convenience, only the array DAC-P will be described in detail.

The array DAC-P comprises a plurality of binary weighted capacitors $C1_P$ to $C6_P$ plus $C6_T$ whose total capacitance sums to a value C. In this example capacitor $C1_P$ represents the most significant bit and capacitor $C6_P$ represents the least significant bit of the array. Capacitor $C1_P$ has a value of C/2. Consequently $C2_P$ has a value of C/4, capacitor $C3_P$ has a value of C/8, capacitor $C4_P$ has a value of C/16, capacitor $C5_P$ has a value of C/32 and capacitor $C6_P$ has a value of C/64. In order to ensure that the array sums to its correct value of C, then a further terminating capacitor $C6_T$, having a value corresponding to the value of the least significant bit is included.

Each of the capacitors have first and second plates which, in a commonly used nomenclature are referred to as "top" and "bottom" plates. The top plates of capacitors $C1_P$ to $C6_T$ are connected to a common rail designated TOP-P which is connected to the positive input of the comparator 12. The bottom plates of capacitor $C1_P$ to $C6_P$ are connected to respective switches $S1_P$ to $S6_P$. The switches are fabricated from transistors. The switch $S1_P$ is a three position switch such that the bottom plate of capacitor $C1_P$ can either be connected to a positive signal input Vinp, to the positive reference voltage Vref or to a negative reference voltage, e.g. ground. Switches $S2_P$ to $S6_P$ are two position switches such that the bottom plate of the respective capacitor can either be switched to ground or to Vref. Capacitor $C6_T$ (which is a repeat of the least significant bit capacitor) is not associated with a switch and its bottom plate is permanently connected to the negative reference voltage, e.g. the ground rail.

The negative capacitor array SAR-N is identical to that in SAR-P with the exceptions that all capacitors and switches are designated with the subscript N, switch $S1_N$ can now connect to a negative signal input Vinn, and that the top plates of capacitors $C1_N$ to $C6_N$ connect to a common rail designated TOP-N that connects to the negative input of the comparator 12.

Sample switches $SS_P$ and $SS_N$ are provided to connect the common node TOP-P and the common node TOP-N to a bias voltage, Vbias, during sampling. Vbias can be freely chosen by the circuit designer although in practice it is generally constrained to lie within the voltage range $-Vref<Vbias<+Vref$. A convenient choice for Vbias is ground because this avoids the need to create a voltage generator solely for the purpose of creating the Vbias voltage. Vbias acts as a reference voltage during sampling of the differential input signal by the converter.

With reference to FIG. 2, it can be seen that each of the switches are implemented as pairs of transistors. For each capacitor its associated switch, such as switch $S2_P$ comprises a first transistor 22, which for convenience can be regarded as a high side transistor, which connects it to Vref and a second transistor 24, which for convenience can be regarded as a low side transistor, which connects it to ground. In this example Vref represents the first reference voltage and ground represents the second reference voltage. In use, it is generally considered to be undesirable for the first and second switches, that is the high side and low side switches, to be simultaneously conducting as this provides a short circuit between the first and second reference voltages which either results in unnecessary dissipation within the device and perturbs the reference voltages thereby leading to inaccuracies in the converted result. In order to avoid the high side and low side switches being conducting at the same time, non-overlap generating circuits 25, for example like the type shown in FIG. 2 are provided. Thus, if we consider capacitor $C2_P$ of FIG. 1 then a first plate of that capacitor is connected to a node 20 which represents the midpoint of a series connection between the two field effect transistors 22 and 24. The first field effect transistor 22 is the high side transistor which is operable to connect to the first plate of the capacitor $C2_P$ to Vref, whereas the second field effect transistor 24 is the low side transistor which operable to connect the first plate of the capacitor $C2_P$ to ground. Clearly if both transistors 22 and 24 are conducting at the same time then current will flow from Vref to ground and the voltage at node 20 is undefined.

In order to overcome these problems a non-overlap generator is used. An example of a prior art non-overlap generator is shown which comprises two NOR gates 26 and 27 and an inverter 28. These are connected together in the configuration shown in FIG. 2.

Suppose we start with a configuration in which each of the transistors 22 and 24 can be made conducting by sending it a "high" or "1", and can be made non-conducting in response to a zero or "0" applied to its gate.

Starting at a steady state condition where an output 36 of the first NOR gate 26 is high, and output 42 of the second NOR gate is low and the input signal at node 30 is low, then this is a stable configuration as:

1) input 32 and 34 of NOR gate 26 are both low so output 36 remains high.
2) input 40 of NOR gate 27 is high, and the effect of the inverter 28 makes input 38 high so the output 42 remains low.

Now consider a transition, where each gate has a propagation delay D.

At switching time t=0 node 30 switches from "0" to "1". At t=0 input 32 becomes "1" while input 34 is still zero. The output of NOR gate 26 starts to change so that it will become "0" at time t=D.

Thus as t=D input 40 of NOR gate 27 goes low. Similarly the action of the inverter causes input 38 to go low at t=D. Thus this gate starts to change state and the output 42 goes high at t=2D.

This gain represents a stable state with node 30="1", output 36="0" and output 42="1".

It can be seen that there was a period from t=D to t=2D when both transistors were non-conducting.

Suppose now that the signal on node 30 changes from 1 to 0 at t=0. Input 32 goes low but 34 remains high so NOR gate 26 remains with its output at "0". Meanwhile the inverter 28 is changing state such that its output becomes high. Thus at time t=D input 40 is low but input 38 is high so the NOR gate 27 starts to transition between states such that at t=2D its output is "0". At this time the output of NOR gate 26 is also "0" but both inputs 32 and 34 have gone low so it starts to change state such that its output becomes high at t=3D.

Thus once again there was a period when both transistors 22 and 24 were non-conducting.

It is clear however that the high side and low side transistors 22 and 24 are effectively controlled in unison with one being on whilst the other is off except during a very brief window generated by the non-overlap circuit. This mode of operation is widely held by persons skilled in the art to be the way that switches for successive approximation converters are and must be driven.

For simplicity the foregoing discussion assumed that a transistor was conducting when its input was "1" and not conducting when its input was "0". Of course this need not be the case and use of other technologies, such as CMOS, may result in the formation of the transistors who conduct when their input voltage is low. As a consequence inverters may be required to achieve the desired operation.

SUMMARY OF THE INVENTION

According to a first aspect of the present invention there is provided a successive approximation analog to digital converter comprising a plurality of capacitors which during a successive approximation conversion are selectively connectable to a first reference or a second reference under the command of a controller, wherein during a conversion step where the connections of a given capacitor may be varied the switches to the given capacitor are both placed in a high impedance state during a decision period of a comparator.

Thus the inventors have realized that, rather than the switches being driven in anti-phase during the bit trials of a successive approximation conversion, that the transistors could beneficially be individually controlled such that capacitors which potentially could be altered as part of a present bit trial or would be altered in order to set a test in a succeeding bit trail could have both their high side and low side transistors placed into a high impedance state before a decision had been made by the comparator whether to keep or reject the bit being tested in the current bit trial.

This has the advantage of allowing the overlap generator to be dispensed with and consequently the switching delay introduced by the overlap generator in the prior art following a decision by the comparator is no longer incurred. This in turn means that the throughput of the analog to digital converter can be increased.

Advantageously each of the transistor switches, whether they be high side or low side switches are driven by a latch which can be latched so as to turn the transistor on or turn the transistor off. Advantageously the circuit responsible for switching a transistor into a conducting state is provided in contact with a control terminal, generally a gate, of the transistor switch such that the transistor can be switched on rapidly by that control circuit. The control circuit also has the ability to force the latch to transition to a state for holding the transistor in a conducting state. Thus, following the decision to switch a transistor on, the control signal does not incur propagation delays associated with propagating through a latch or a non-overlap generator, but instead is applied to the gate of the relevant transistor switch whilst also directly forcing the latch to transition, or alternatively causing other combinational logic to instigate a transition of the latch, to a new state. Thus not only is the switch off time for the transistors brought into the period whilst the comparator is regenerating, that is making its decision, but additionally the propagation delay between the output of the comparator and the relevant transistor switch is much reduced because the control signal does not have to propagate through a latch or through a non-overlap generator.

According to a second aspect of the present invention there is provided a successive approximation converter comprising a plurality of capacitors, wherein the switches associated with a capacitor representing a bit weight in a bit trial can be individually controlled such that a capacitor can be connected to either a first reference voltage or to a second reference voltage by electronically controlled switches, and during a bit trial the switches can be controlled such that a capacitor that is being trialled, or that will be altered for the next bit trial, is disconnected from the reference voltages prior to the completion of the bit trial so as to reduce a switching time to change a connection status of the capacitor.

According to a third aspect of the present invention there is provided a capacitive digital to analog converter wherein a controller controls switches connecting individual capacitors to either a first voltage or a second voltage and wherein the controller can prepare to change a capacitor's connection between the first and second voltage by placing the switches for the capacitor in a high impedance state until a trigger event occurs.

According to a fourth aspect of the present invention there is provided a control circuit for a transistor, comprising a latch having an output connected to a control terminal of the transistor, and a switch on circuit connected to the output of the latch such that activation of the switch on circuit causes the transistor to switch on and also forces the latch to transition to an on state so as to hold the transistor on after the switch on circuit has switched off.

BRIEF DESCRIPTION OF THE DRAWINGS

The present invention will further be described, by way of non-limiting example only, with reference to the accompanying drawings, in which:

FIG. 7 schematically illustrates how the transistors that are selected to be placed in a high impedance state during comparator regeneration vary during the conversion;

DESCRIPTION OF PREFERRED EMBODIMENTS

Figure 2:
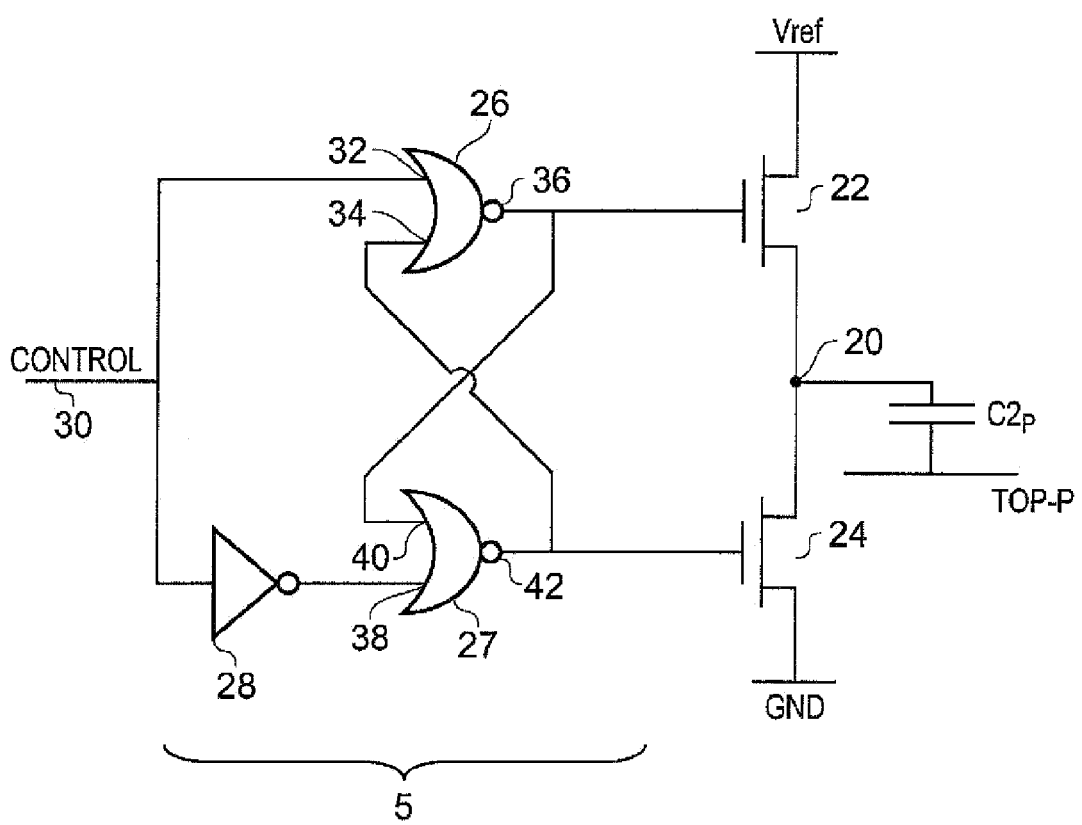
FIG. 2 shows a prior art non-overlap generator for ensuring that switching transistors are not simultaneously conducting during a transition of a capacitor status.
Figure 3:
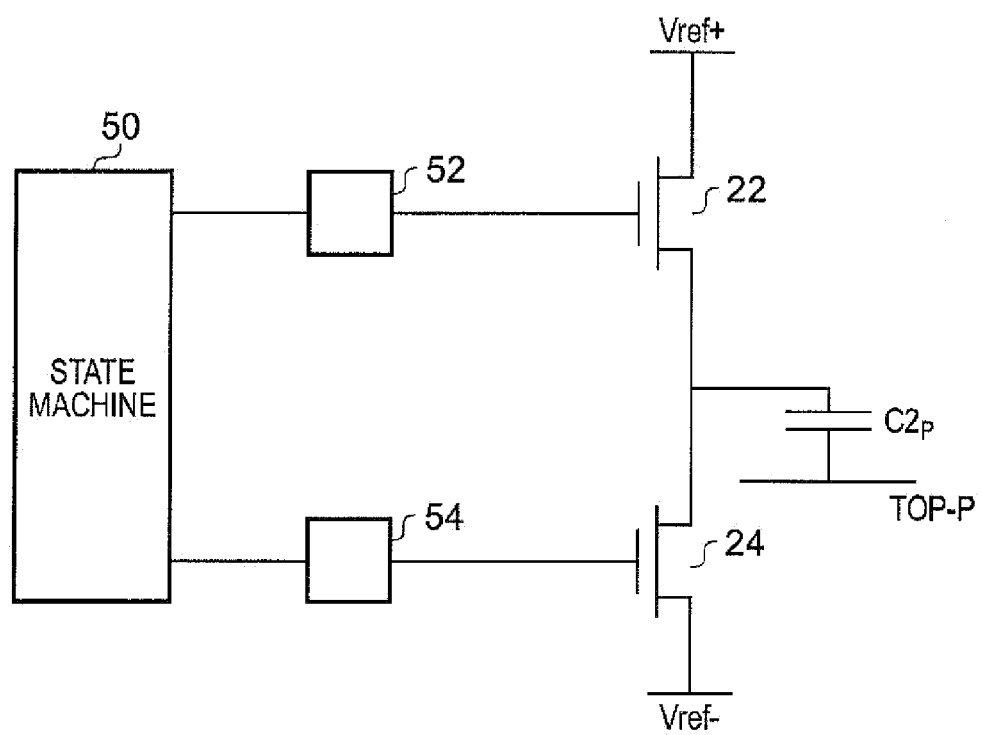
FIG. 3 schematically illustrates transistor switch control circuits in a successive approximation converter constituting an embodiment of the present invention.

FIG. 3 schematically illustrates a drive arrangement for one pair of high side and low side switches which are used to connect a capacitor of a capacitor array to either first or second reference voltages, Vref+ and Vref− within a successive approximation converter. For simplicity, the same capacitor and switching transistors are considered in FIG. 3 as were illustrated in FIG. 2.

Figure 4:
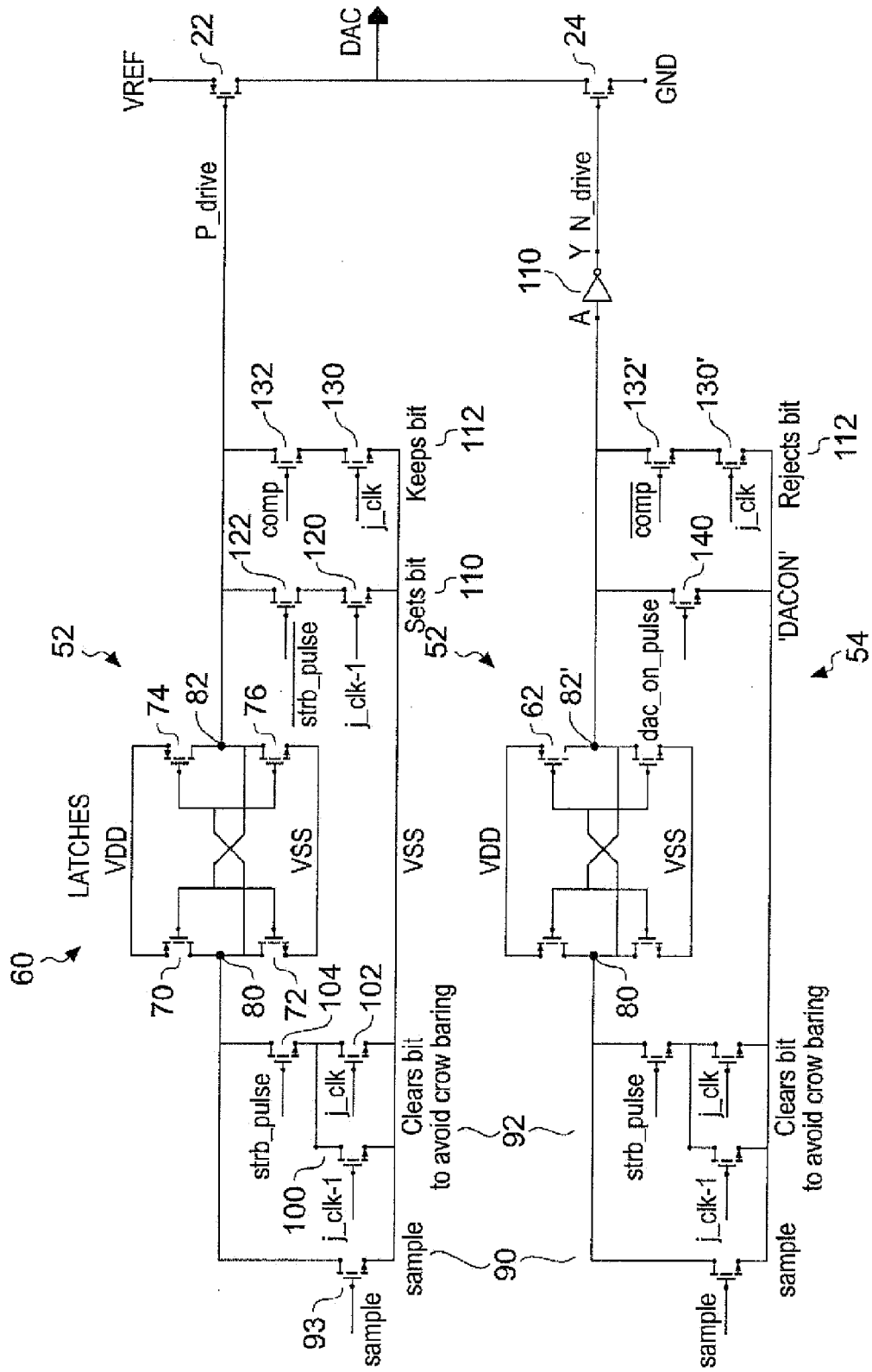
FIG. 4 is a circuit diagram of a transistor control and latch apparatus constituting an embodiment of the present invention.

The sequence of transistor switching performed as part of the successive approximation conversion process is controlled by a state machine 50 which selects which capacitors are to be trialled, and hence which transistors are to be selected for potential switching within any given bit trial. Each transistor has an associated transistor control circuit of which circuit 52 is arranged to control transistor 22 and the circuit 54 is arranged to control transistor 24. The circuits 52 and 54 may receive their control signals solely from the state machine 50 or, as shown in FIG. 4, they may incorporate some of the memory functionality required to select a bit during the successive approximation conversion bit trials and to maintain that bit as being set if the result of the comparison decides that a bit is to be kept. However it can be seen that the circuits 52 and 54 are separate and hence each has the ability to switch its associated transistor off irrespective of whether the other control circuit has placed its transistor in a conducting or non-conducting state. Thus the control signals to the transistors are no longer inverted versions of one another, subject to the very brief and transitory modification of the signals made as a result of the operation of the non-overlap generator.

FIG. 4 is a circuit diagram of a further embodiment of the present invention. The arrangement shown in FIG. 4 has a first transistor controller, generally labelled 52 so as to maintain conformity with FIG. 3, driving the high side transistor 22 and a further transistor controller 54 driving a low side transistor 24. Each controller 52 and 54 comprises a latch of which only the latch generally designated 60 within the controller 52 will be described in detail. The corresponding latch 62 in the second controller 54 is identical. The latch 60 comprises four transistors 70, 72, 74 and 76 of which transistor 70 and 74 are P type transistors and transistors 72 and 76 are N type transistors. Sources of transistors 70 and 74 are connected to the positive supply rail VDD whereas sources of the N type transistors 72 and 76 are connected to the negative supply rail VSS. A drain of transistor 70 is connected to a drain of transistor 72 and also to a first latch control node 80. A drain of transistor 74 is connected to a drain of transistor 76 and also to a second latch control node 82. Gates of the transistors 70 and 72 are connected to the second latch control node 82 whereas gates of the transistors 74 and 76 are connected to the first latch control node 80. The control nodes 80 and 82 represent nodes indicative of the state of the latch and can be used as both input and output nodes. Each of the latches 60 and 62 has circuits 90 and 92 connected to their first control nodes 80. Each of the circuits 90 and 92 comprises transistors arranged to pull the node 80 down to ground, or VSS, as appropriate. Thus the circuit 90 mainly comprises a further transistor 93 which can be switched into a conducting state during a sample period so as to pull the node 80 low. The circuit 92 comprises transistors 100 and 102 which are selected by a Johnson or ring counter within the state machine 50 so as to identify those capacitors within a given bit trial of a successive approximation conversion which could be subject to change in either this trial or which are to be set to a trial state in the succeeding trial. The transistors 100 and 102 are in parallel such that they act as an OR gate and then their output is effectively ANDed with a strobe pulse control signal by a further transistor 104. Thus, if either transistors 100 or 102 are in a conducting state because they have been turned on by the ring counter within the state machine, then upon assertion of a strobe pulse signal the control node 80 will be taken low. In an alternative embodiment one of the transistors can be omitted.

If the control node 80 is pulled down by either circuit 90 or 92 then the N type transistor 76 becomes non-conducting and the P type transistor 74 becomes conducting. As a consequence the node 82 goes high. This in turn causes the P type transistor 70 to become non-conducting and the N type transistor 72 to become conducting. This sets the latch in a stable condition where node 80 will remain low even when the circuits 90 or 92 stop pulling it low.

In the embodiment shown in FIG. 4 transistor 22 is a P type transistor such that node 82 going high causes transistor 22 to become non-conducting. The circuits 90 and 92 are repeated for each of the latches 60 and 62 and operated in unison such that nodes 80 and 80' where' designates the second latch 62 on both latches 60 and 62 are driven low simultaneously and consequently the output nodes 82 and 82' on each latch go (or remain) high simultaneously. As transistor 24 is an N type transistor an inverter 110 is provided so as to switch the transistor 24 off. Alternatively the circuits 90 and 92 associated with the second latch 62 could be arranged to pull the node 80 up rather than down. Thus activation of the sample signal or the strobe pulse signal when either transistor 100 or 102 is conducting causes the latches 60 and 62 to place their respective transistors 22 and 24 into a non-conducting state. The strobe pulse signal "strb-pulse" is also used to instruct the comparator 12 of FIG. 1 to start making comparison. Therefore it can be seen that the transistors 22 and 24 are switched into a high impedance state immediately the comparator starts regenerating, that is entering its decision process. Prior to the start of regeneration one of the transistors would have been conducting whereas the other would not be conducting.

The output node 82 is connected to two further circuits 110 and 112 which each comprise field effect transistors in series extending between the output node 82 and VSS so as to be able to pull the output node 82 down, thereby switching transistor 22 on irrespective of the state of the latch 60. Circuit 110 comprises a transistor 120 which is driven by the ring counter in the state machine so as to enable the node 82 to be pulled low thus turning transistor 22 on so as to set the bit for trialling. Transistor 120 is in series with a further transistor 122 driven with an inverted version of the strb-pulse signal.

The circuit 112 comprises a field effect transistor 130 which is also responsive to the output of the state machine so as to select the transistor 22 for potentially being changed when it is participating in the current (Nth) bit trial and a further transistor 132 in series with it which is responsive to an output of the comparator 12 and which is switched on if the comparator decides that the current bit in the bit trail should be kept. Therefore if the latch 60 is in a state where node 82 is high such that transistor 22 is non-conducting, but the capacitor associated with the transistor 22 is the capacitor which is being tested in the current bit trial then the state machine will select transistor 130 so as to be conducting. The comparator's outputs COMP and $\overline{\text{COMP}}$ are both held low whilst the comparator is making a decision in response to the strobe signal. However once a decision period has elapsed then one or other of the outputs can go high at the end of a decision period. Assuming that the comparator selects the current bit to be kept then the input to transistor 132 goes high such that both transistors 130 and 132 become conducting thereby enabling the voltage at the latch node 82 to be pulled down. This immediately causes transistor 22 to become conducting and also causes the latch to initiate a state transition such that it will become stable and hold node 82 low.

The circuit at the output of latch 62 is similar in that a circuit 112' comprising transistors 130' and 132' with transistor 130' being switched on at the same time as transistor 130.

However transistor 132' is connected to the complimentary latch output $\overline{COMP}$ and hence remains low after the comparator has decided to keep the current bit on trial.

If, however, the comparator had decided to reject the current bit on trial then $\overline{COMP}$ would have gone high such that transistors 130' and 132' would have dragged node 82' of the latch 62 low thereby switching transistor 24 on whereas transistor 132 would remain non-conducting thereby leaving node 82 of the latch 60 high.

It can thus be seen that, in each bit trial, the transistors which are associated with the capacitor currently under trial or with the capacitor which will be set for the subsequent trial are both placed into a high impedance state immediately the comparator is instructed via the strobe pulse to commence regeneration. It can also be seen that immediately the comparator makes a decision the transistors are switched to an appropriate state by opening a current path via transistors 120, 130 and 132 as appropriate that acts to turn them on and that this path exists between an output node 82 of the latch and a ground or supply rail. Thus propagation delays associated with changing the state of the latch are avoided.

The second latch 62 is also associated with a further pull down transistor 140 which is responsive to a "DACON" pulse in order to reset the capacitor array to an initial state at the start of each conversion cycle.

Figure 5:
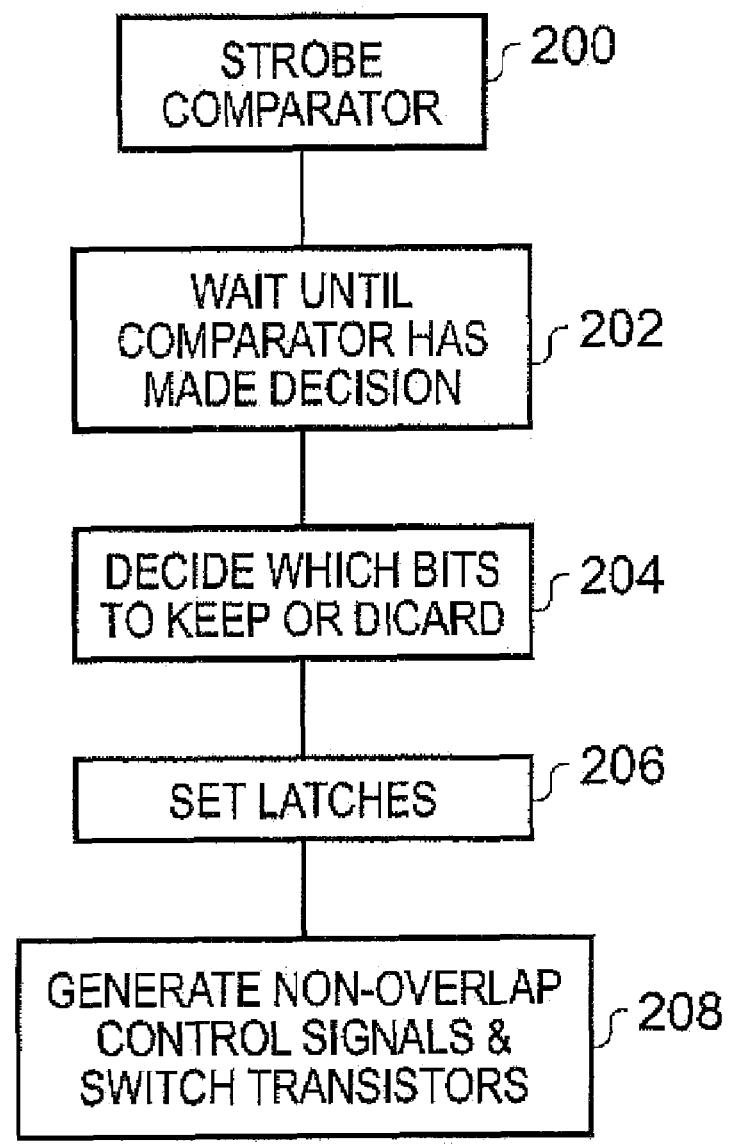
FIG. 5 is a flow diagram showing the sequence of operations performed during a bit trial in a prior art converter.
Figure 6:
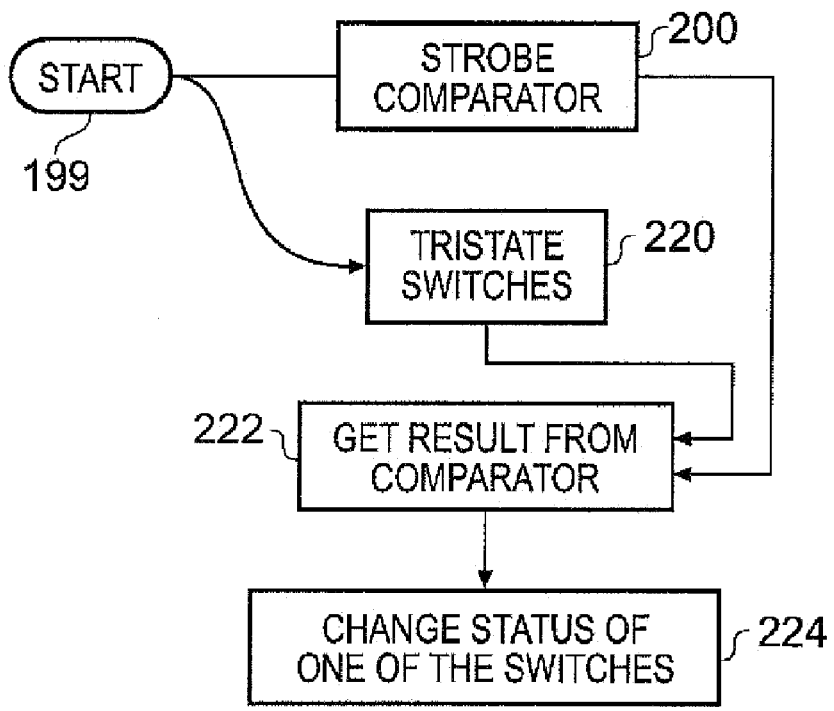
FIG. 6 shows the equivalent sequence of operations in a successive approximation converter constituting an embodiment of the present invention.

FIGS. 5 and 6 compare the operation of a analog to digital converter operating in accordance with the prior art and an analog to digital converter operating in accordance with the present invention. In the prior art arrangement shown in FIG. 5, during each bit trial within a complete conversion the bit being trialled is set. After a settling time a strobe signal is sent to the comparator in order to enable the comparator to perform its test. Thus, as shown in FIG. 5, the signal to strobe the comparator is issued at step 200. From then a time out period is normally allowed to elapse to allow the comparator to make its decision, thus, from step 200 control passes from step 202 where the time out period is counted. From there control passes to step 204 where the or each output of the comparator is examined in order to determine whether the bit which has just been trialled is to be kept or discarded. From step 204 the comparator output is used to set the transistor control latches at step 206 which are used to remember the decision made at each bit trail. From step 206 control is passed to step 208 where the output of the latch, which has been subject to latch propagation delay, is passed to the non-overlap circuit shown in FIG. 2 in order to generate the control signals for the transistors 22 and 24 and then cause them to switch. It can therefore be seen that in the prior art no attempt is made to switch the transistor states of the high side and low side transistors involved in a bit trial and which could be subject to change until such time as the comparator has made its decision. The decision from the comparator is then subject to gate propagation delays in both the latch used to record the decision of the comparator and then the non-overlap generator circuit.

If this is compared with the present invention, as set out in FIG. 6, we can see that control commences at step 199 and then moves up to step 200 where following set up of the bit trial the comparator is instructed to start its comparison. Simultaneously a strobe pulse signal is also supplied to the input node 80 and 80' of the latches 60 and 62 causing each of them to switch their respective transistor 22 and 24 (being transistors associated with a capacitor whose switching state will be changed in the current bit trial or which will be set for the succeeding bit trial) into a high impedance state. Thus, effectively, the switching stage formed by transistor 22 and 24 is placed into a tri-state, i.e. high impedance, condition. Control then passes to step 222 where the result of the comparator is awaited. After the comparator decision period has finished control passes to step 224 where the result of the comparator's decision is applied to the control inputs of the high side and low side transistors 22 and 24. Simultaneously the result of the comparator's decision is also applied to the output nodes 82 and 82' of the latches 60 and 62 so as to cause them to transition, if necessary, to the state appropriate to the decision of the comparator. Crucially, the signals for controlling the high side transistor 22 and the low side transistor 24 do not become delayed by propagation delays in proceeding through the latches or through a non-overlap generating circuit. As a result the time to propagate the result of the comparator through the various gates so as to effect the desired changes at the high side and low side switches is much reduced compared to the prior art arrangement and consequently there is less digital dead time within the successive approximation conversion process. As a result the total conversion time required to complete a successive approximation conversion is reduced and hence the converter throughput is increased.

It is thus possible to provide an improved analog to digital converter.

It should be noted that because the switched capacitor array effectively forms a digital to analog converter within the analog to digital converter the present invention can also be used to increase the throughput of a digital to analog converter by enabling the transistors thereof to be switched into non-conducting states just prior to a transition from one digital word to the next. This again would avoid the risk of crow barring occurring as a result of both the high side and low side transistors inadvertently conducting current at the same time.

As noted hereinbefore with respect to the discussion of FIG. 4 transistors 100 and 102, and similarly 120 and 130 are responsive to a ring counter within a state machine in order to cause the latches to place their respective transistors into a high impedance mode during bit trials in which the capacitor may be changed or where it will be set for the following bit trial. This can be considered in more detail with respect to FIG. 7. Consider the bits within an 8 bit converter (8 bits are chosen for simplicity but in reality the converter is likely to have 14 or 16 bits if not more). Suppose bit 1 represents the most significant bit and bit 8 represents the least significant bit. At the start of the conversion process the sample signal is asserted in order to cause the high side and low side transistors of each and every single capacitor to be placed into a high impedance state. Then a sample switch (not shown) can be opened in order to allow a charge to be sampled onto the capacitor array. The sample signal (provided to transistor 93) is then released, but the high side and low side transistors will remain non-conducting because of the operation of the latches 60 and 62. Transistor 120 is then selected to be conducting for the most significant bit so as to place a "1" on the most significant bit whilst the remaining bits in the DAC array are zero.

Figure 1:
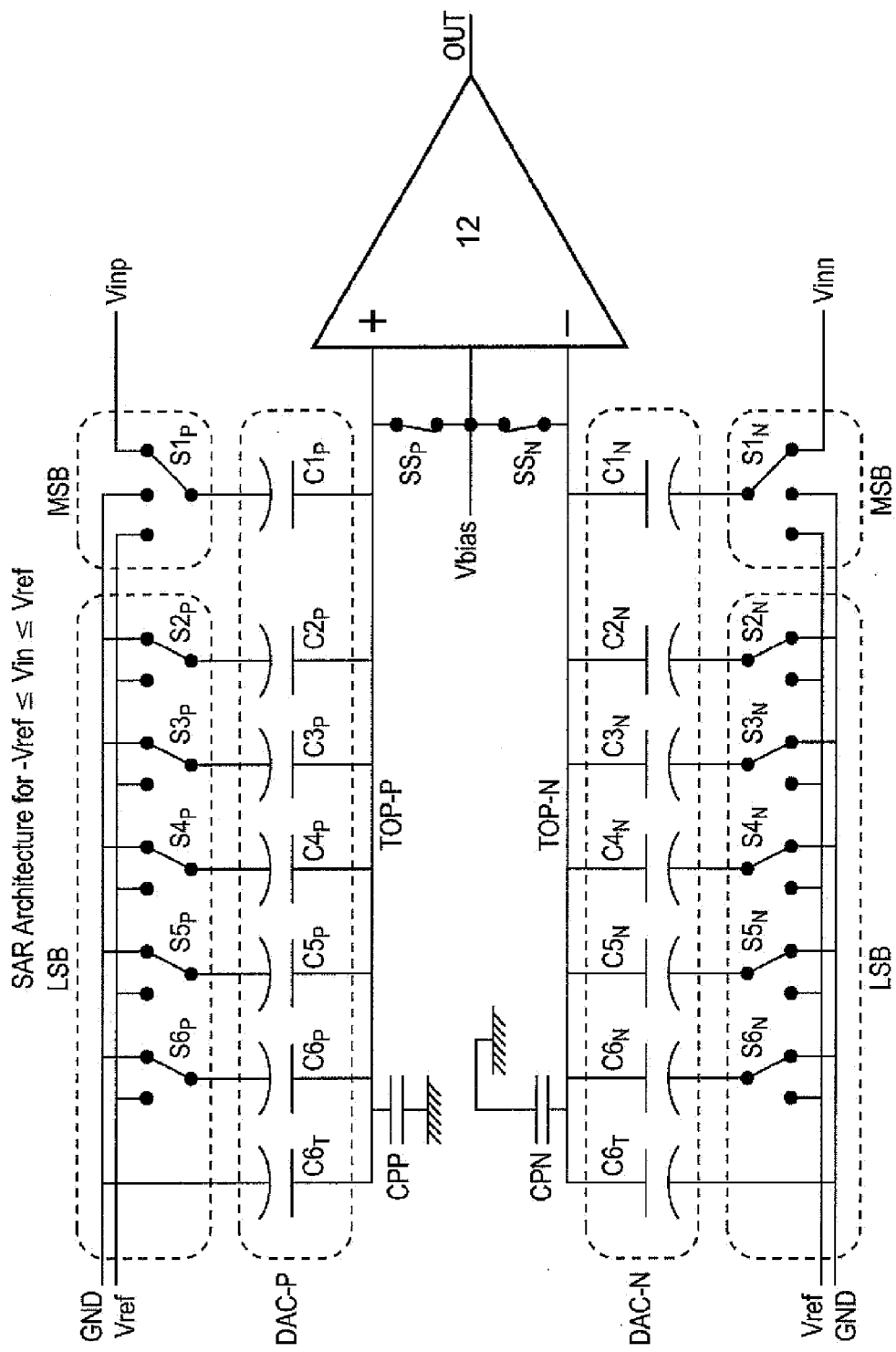
FIG. 1 schematically illustrates the switched capacitor successive approximation converter.
Figure 7:
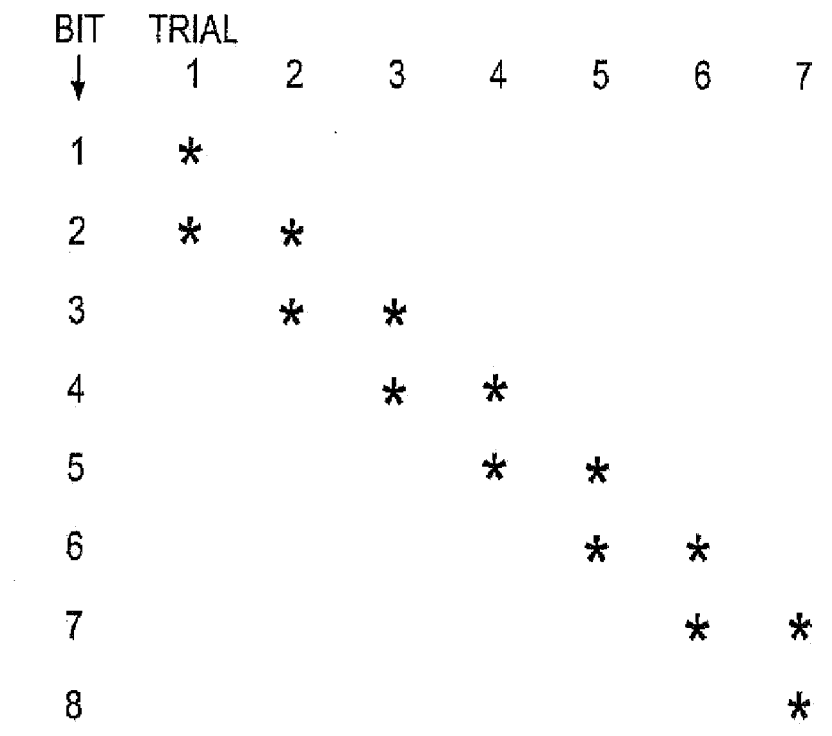

Where, as shown in FIG. 1, a differential analog to digital converter is used then the initial word "10000000" is placed on the P array and the complimentary word 01111111 is placed on the N array. The strobe signal is then asserted and simultaneously the state machine increments the ring counter therein so as to select the second bit. As a consequence the high side and low side transistors associated with the most significant bit and the next most significant bit, bit 2 are placed into a high impedance state whilst the comparator is regenerating. Once the comparator has reached the end of its decision, its output is provided to transistors 132 and 132' whilst the signal strb-pulse is de-asserted to avoid contention across the latch so as to set the most significant bit to be either kept or discarded, as appropriate. Additionally, whilst the comparator is in its decision period the bit for the second bit is asserted. Following a wait period of sufficient duration to enable settling to occur within the capacitor array the strobe pulse is asserted causing the comparator to consider the result of the second bit trial, and also placing the high and low side transistors for the current bit trial, bit 2 and the next bit trial, bit 3 into a high impedance state. Once the comparator has made its decision the transistors 22 and 24 for the second capacitor are set depending upon the output of the comparator and substantially simultaneously the capacitor for the third bit is set in preparation for the third bit trial. The process then repeats as indicated in FIG. 7 where the "*" represents the transistors associated with the binary weighted capacitors of the capacitor array which are based into a high impedance state pending the result of the current bit trial.

Because the transistors associated with the nodes 80 and 82 of the latch 60 pull these nodes down, then VDD does not have to be at the same voltage as the supply rail used for logic gates driving the latch 60. Thus the latch can also be used as a level shifting circuit.

The arrangement shown in FIG. 4 is suitable for all the capacitors in the converter, although the arrangement can usefully be modified for the MSB by supplying the "DAC_ON" pulse to transistor 120 and omitting transistor 140.

Figure 8:
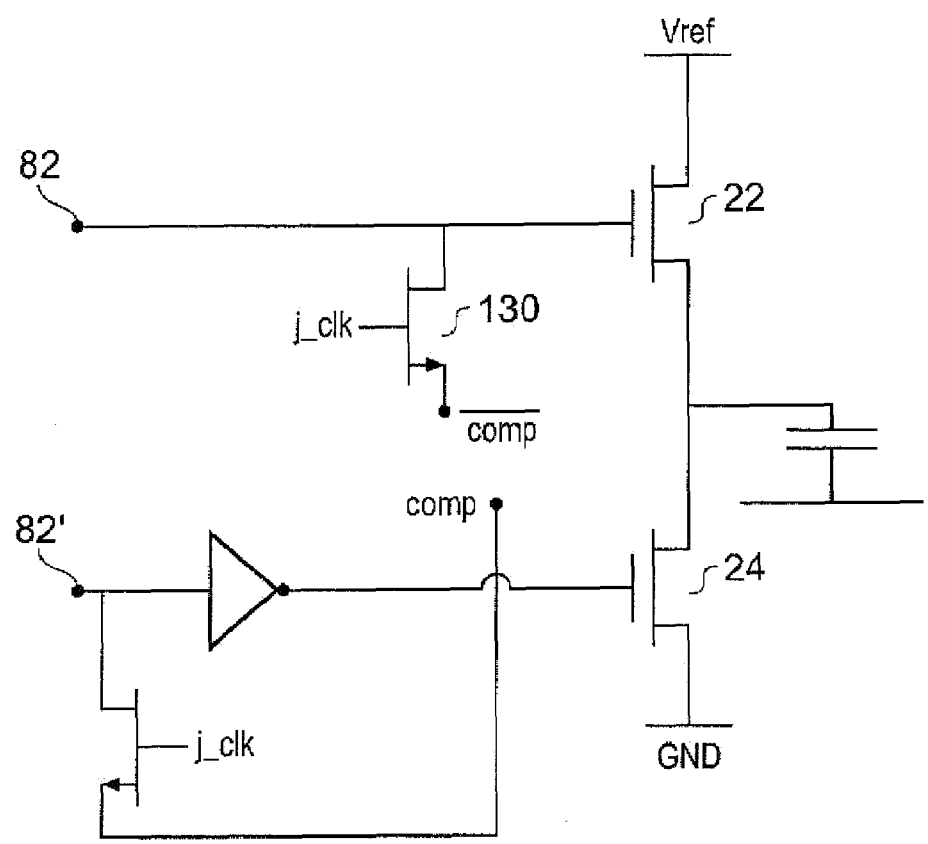
FIG. 8 shows an alternative arrangement for part of the circuit shown in FIG. 7.

The stage formed by transistors 130 and 132 may be modified such that, for example, the source of transistor 130 is connected directly to the output of the comparator 12 whose outputs are inverted and transistor 132 is omitted so that the drain of transistor 130 connects to node 82. A similar arrangement can be implemented in relation to node 82' for the low side transistors, and this alternative arrangement is shown in FIG. 8.

In the example given the transistors 120 and 130 in combination with 132 act to cause the node 82 to be pulled down. It can be seen that this functionality could also be achieved by a suitable modification of the control signal applied to transistor 76.

Figure 9:
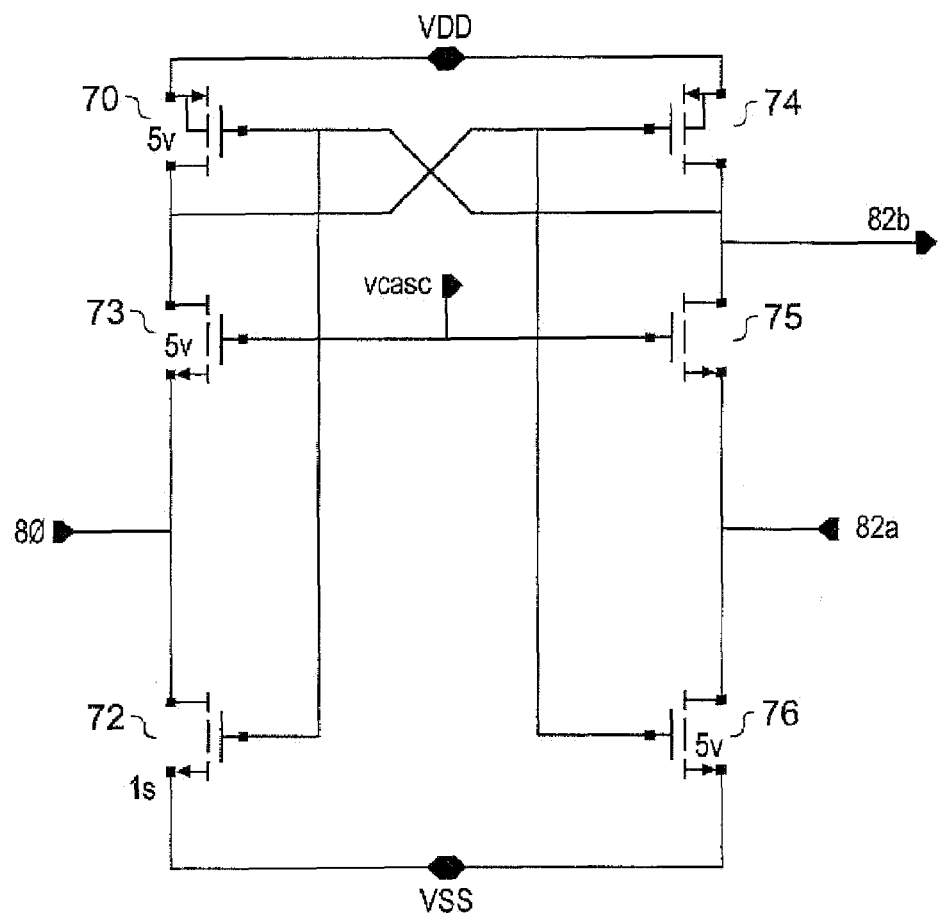
FIG. 9 shows an alternative latch circuit.

FIG. 9 shows an alternative embodiment of the latch 60. Like parts have been designated with like references numerals. The latch includes cascode devices 73 and 75. A node 82$b$ is used to control transistor 22 while circuits 110 and 112 couple to the input node 82$a$. The cascode devices limit the voltage seen by the circuits 90, 92, 110 and 112 allowing lower geometry and thus faster devices to be used in these circuits. The gates of the cascode devices can be driven directly by the lower supply voltage or can be biased a little higher which has the effect of increasing the speed of the latch.

In the example described, strb-pulse goes high at substantially the same time as the counter controlling the bit trials is incremented. In an alternative embodiment which requires a slightly modified arrangement of switches controlling nodes 80 and 82, the negative edge of strb-pulse occurs at substantially the same time as the counter increments and the comparator result is fed to transistor 132 and 132' just after the counter increments.

The invention claimed is:

1. A successive approximation analog to digital converter comprising a plurality of capacitors each of which during a successive approximation conversion is selectively connectable through at least first and second switches to a first reference or a second reference, respectively, under the command of a controller,
   wherein during a conversion step said switches are placed in a high impedance state during a decision period of a comparator.

2. A successive approximation analog to digital converter as claimed in claim 1, wherein the converter has N bits, and during the trial of an Mth bit ($1 \leq M \leq N$) switches associated with connecting a capacitor which is being tested as part of the Mth bit trial are placed in a high impedance state following or contemporaneously with the start of a comparison process made by the comparator.

3. A successive approximation analog to digital converter as claimed in claim 2 in which the switches associated with a capacitor, the connection status of which will be changed as part of the M+1th bit trial, are placed in a high impedance state following or contemporaneously with the start of the comparison process for the Mth bit trial made by the comparator.

4. A successive approximation analog to digital converter as claimed in claim 1, wherein each comparator is associated with a high side transistor switch for connecting a first plate of the capacitor to the first reference and a low side transistor switch for connecting the first plate of the capacitor to a second reference, and each said transistor is driven by a respective latch.

5. A successive approximation analog to digital converter as claimed in claim 4, in which an output of at least one of said latches is arranged to provide a control signal to its respective transistor and wherein a further pull up or pull down circuit is connected to said latch so as to force said latch to transition to a state imposed upon it by the pull up or pull down circuit.

6. A successive approximation analog to digital converter as claimed in claim 5, where a pull up or pull down circuit is connected to said latch to force it to adopt a state where its respective transistor is non-conducting.

7. A successive approximation analog to digital converter as claimed in claim 5, where a pull up or pull down circuit is connected to said latch to force it to adopt a state where its associated transistor is conducting.

8. A successive approximation analog to digital converter as claimed in claim 5, where said latch is a bi-stable circuit and has two connections, the first of which when pulled to a first voltage sets the latch to a first state, and a second of which when pulled to the first voltage sets the latch to a second state.

9. A successive approximation analog to digital converter as claimed in claim 5, where said latch functions as a level shifting circuit.

10. A switchable capacitor successive approximation converter where a plurality of capacitors within a capacitor array are selectively connectable by respective first switches to a first reference voltage and by respective second switches to a second reference voltage, wherein during a bit trial in which a switching status of a given capacitor may be changed, the first and second switches are controllable such that both switches can be placed in a high impedance state and held there until the result of the bit trial is known.

11. A capacitive digital to analog converter wherein a controller controls switches connecting individual capacitors to either a first voltage or a second voltage and wherein the controller can prepare to switch a capacitor's connection between the first and second voltage by placing the switches for a capacitor in a high impedance state until a trigger event occurs.

12. A control circuit for a transistor, comprising a latch having an output connected to a control terminal of the transistor, and a switch on circuit connected to the output of the latch such that activation of the switch on circuit causes the transistor to switch on and also forces the latch to transition to an on state so as to hold the transistor on after the switch on circuit has switched off.

13. A digital to analog converter including a control circuit as claimed in claim 12.

14. An analog to digital converter including a control circuit as claimed in claim 12.

15. A method of operating a successive approximation analog to digital converter comprising a plurality of capacitors, said method comprising:
during a successive approximation conversion, selectively connecting each of said plurality of capacitors to a first reference or to a second reference, through at least one switch, under the command of a controller; and
during a conversion step where the connections of given capacitor may be varied, placing the switches to the given capacitor in a high impedance state during a decision period of a comparator.

16. A method according to claim 15 wherein the converter provides N bits of output value and, during the trial of an Mth bit ($1 \leq M \leq N$), placing the switches associated with connecting a capacitor which is being tested as part of said trial into a high impedance state following or contemporaneously with the start of a comparison process made the comparator.

17. A method according to claim 15, including placing in a high impedance state the switches associated with a capacitor whose connection status will be changed as part of the M+1th bit trial, following or contemporaneously with the start of a comparison process for the Mth bit trial made by the comparator.

18. A method according to claim 15, wherein said at least once switch comprises a high side transistor for connecting a first plate of the capacitor to the first reference and a low side transistor for connecting the first plate of the capacitor to a second reference, each transistor is driven by a respective latch.

19. A method according to claim 18, further comprising connecting a pull up or pull down circuit to each said latch to force it to adopt a state where the respective transistors for a said capacitor are concurrently non-conducting during said decision period.

20. A method of operating a switchable capacitor successive approximation converter where a plurality of capacitors within a capacitor array are selectively connectable by respective first switches to a first reference voltage and by respective second switches to a second reference voltage, said method comprising, during a bit trial in which a switching status of a given capacitor may be changed, controlling the first and second switches such that both of said switches are placed in a high impedance state and held there until the result of the bit trial is known.

* * * * *